(12) United States Patent
Lee

(10) Patent No.: US 6,611,030 B1
(45) Date of Patent: Aug. 26, 2003

(54) CMOSFET WITH CONDUCTIVE, GROUNDED BACKSIDE CONNECTED TO THE WIRING LAYER THROUGH A HOLE THAT SEPARATES THE MOSFETS

(75) Inventor: Hi-deok Lee, Cheongju (KR)

(73) Assignee: Hyundai Electronics Industries Co, Ltd., Ichon-shi (KR)

( * ) Notice: Subject to any disclaimer, the term of this patent is extended or adjusted under 35 U.S.C. 154(b) by 0 days.

(21) Appl. No.: 09/487,227

(22) Filed: Jan. 19, 2000

(30) Foreign Application Priority Data

Jan. 22, 1999 (KR) .......................................... 1999/1988

(51) Int. Cl.[7] .............................................. H01L 21/02
(52) U.S. Cl. ........................ 257/369; 257/374; 257/618
(58) Field of Search ................................. 257/369, 374, 257/371–372, 503, 508, 520, 618, 621–622, 901; 327/424, 473

(56) References Cited

U.S. PATENT DOCUMENTS 4,978,639 A * 12/1990 Hua et al. ................... 438/465
5,827,747 A * 10/1998 Wang et al. ................. 438/199
6,052,017 A * 4/2000 Pidutti et al. ............... 327/424
6,297,533 B1 * 10/2001 Mkhitarian ................. 257/336

OTHER PUBLICATIONS

Muller et al., Device Eletroniics for Integrated Circuits, 1986, John Wiley & Sons, Inc., 2nd Ed., pp. 422–424.*

* cited by examiner

Primary Examiner—Minh Loan Tran
Assistant Examiner—Thomas L Dickey
(74) Attorney, Agent, or Firm—Fleshner & Kim, LLP

(57) ABSTRACT

An improved semiconductor device, and a corresponding fabrication method thereof, are provided that include a ground region defined in a semiconductor substrate. A hole is formed using a known electropolishing system to electropolish a portion of a bottom surface of the substrate which corresponds to the ground region. A metal layer is formed on the bottom surface of the substrate and in the hole. The metal layer serves as ground by being linked with a ground metal line formed on a substrate surface.

28 Claims, 5 Drawing Sheets

CM OSFET WITH CONDUCTIVE, GROUNDED BACKSIDE CONNECTED TO THE WIRING LAYER THROUGH A HOLE THAT SEPARATES THE MOSFETS

BACKGROUND OF THE INVENTION

1. Field of the Invention

The invention relates to a semiconductor device, and more particularly to a semiconductor device and a fabrication method thereof suitable for high-integration and performance devices.

2. Background of the Related Art

FIG. 1A is a cross-sectional view of a related semiconductor device and FIG. 1B is a circuit diagram of the device of FIG. 1A. As shown therein, a semiconductor substrate 1 having a p-well 1a and a n-well 1b has an active region comprising first and second transistor regions T1, T2 and a field region consisting of first and second field parts F1, F2, the first and second transistor regions T1, T2 belonging to the p-well and the n-well, respectively. Further, field oxide films 2a, 2b of a local oxidation of silicon (LOCOS) structure are respectively formed over portions of the substrate 1 having the first and second field parts F1, F2. However, in the field parts F1, F2 field oxide films (not shown) of a shallow trench isolation (STI) structure may be formed instead of the field oxide films of LOCOS.

In addition, gate electrodes 4a, 4b are formed on portions of the substrate 1 corresponding to the first and second transistor regions T1, T2, respectively, and gate oxide films 3a, 3b are respectively formed therebetween. Impurity regions 5a, 5b doped with first and second conductive impurities are formed in the first and second transistor regions T1, T2, respectively, at both sides of each of the gate electrodes 4a, 4b. Here, the impurity regions 5a, 5b serve as source and drain, and the first conductive impurity is a n-type while the second conductive impurity is a p-type.

Further, a layer of insulating film 6 having a plurality of contact holes 6a is formed over a surface of the structure. The contact holes 6a expose portions of the substrate 1 corresponding to the impurity regions 5a, 5b. First, second and third wiring patterns 7a, 7b, 7c are formed in the contact holes 6a and on an upper surface of the layer-insulating film 6. As shown in FIGS. 1A and 1B, the first, second and third wiring patterns 7a, 7b, 7c are used as a ground (GND) line, an output voltage (VOUT) line, and a source voltage (VDD) line, respectively, and the gate electrodes 4a, 4b are respectively used as an input voltage (Vin) line.

A protection film pattern 8 having a plurality of openings (or bonding pad units) 8a is formed to prevent scratching and contamination of the structure surface. The openings 8a expose portions of the wiring patterns 7a, 7b, 7c. The portions of the wiring patterns 7a, 7b, 7c exposed by the openings 8a are referred to as bonding pads 9a, 9b, 9c, 9d. The bonding pad 9a which corresponds to the second wiring pattern 7a is connected to ground.

In such related semiconductor devices, as the sizes of devices integrated on the substrate decreases due to high integration of devices, the number of bonding pads which are connected to electrodes of the devices also increases, which results in an increase in the size of the bonding pads. Further, since voltage drop occurs to wiring lines which are electrically connected to the bonding pads connected to the source and ground, operational properties of the devices deteriorate.

The above description and/or references are incorporated by reference herein where appropriate for appropriate teachings of additional or alternative details, features and/or technical background.

SUMMARY OF THE INVENTION

Accordingly, the invention is directed to a semiconductor device and a fabrication method thereof which obviates at least the above-described problems and disadvantages.

An object of the invention is to stabilize operational properties of the integrated devices.

Another objection of the invention is to prevent voltage drop in a ground line.

Another object of the invention is to form a metal layer which is linked with a wiring layer serving as a ground line formed at a bottom surface of the substrate.

To achieve these and other advantages of the invention, as embodied and broadly described, a semiconductor package according to a preferred embodiment of the invention is provided that includes: a semiconductor substrate having an active region comprising two transistor regions, a ground region and two field regions; field oxide films formed on the substrate in the field regions, respectively; gate electrodes formed over predetermined portions of the substrate corresponding to the transistor regions, respectively; gate oxide films interposed between the substrate and the corresponding gate electrodes; impurity regions doped with first and second conductive impurities, respectively, which are formed on both sides of each of the gate electrodes in the transistor regions, respectively; a layer-insulating film having a plurality of contact holes formed over the semiconductor substrate, the field oxide films, the gate electrodes and the impurity regions, the layer-insulating film exposing portions of an upper surface of the substrate corresponding to the ground region and the impurity regions; first, second and third wiring layer patterns formed on the layer-insulating film and in the contact holes; a protection film pattern having a plurality of contact holes formed over the semiconductor substrate, the field oxide films, the gate electrodes, the impurity regions, the layer-insulating film and the first, second and third wiring layer patterns, the protection film pattern forming bonding pads corresponding to the first, second and third wiring layer patterns, respectively; a hole formed on a portion of a bottom surface of the substrate corresponding to the ground region; and a metal layer formed on a bottom surface of the substrate and on an inner surface of the hole.

Also, to achieve the above object of the invention, there is provided according to a preferred embodiment of the invention a fabrication method of a semiconductor device, including: providing a semiconductor substrate having an active region comprising first and second transistor regions, a ground region and first and second field regions; forming field oxide films on the substrate in the field regions, respectively; forming gate electrodes over predetermined portions of the substrate corresponding to the first and second transistor regions, respectively; interposing gate oxide films between the substrate and the corresponding gate electrodes; forming, in a separate process, impurity regions doped with first and second conductive impurities, respectively, which are formed on both sides of each of the gate electrodes in the transistor regions, respectively; forming a first conductive ion diffusion layer in the ground region; forming a layer-insulating film having a plurality of contact holes over the semiconductor substrate, the field oxide films, the gate electrodes, the conductive ion diffusion layer and the impurity regions, the layer-insulating film exposing portions of an upper surface of the substrate corresponding to the impurity regions and the ion diffusion layer; forming first, second and third wiring layer patterns on the layer-insulating film and in the contact holes by depositing a wiring layer and then selectively etching the layer to form the patterns; forming a protection film pattern having a plurality of contact holes (or bonding pad units) by depositing a protection film over the semiconductor substrate, the field oxide films, the gate electrodes, the impurity regions, the conductive ion diffusion layer, the layer-insulating film and the first, second and third wiring layer patterns and selectively etching the protection film for thereby forming bonding pads; forming a hole in a bottom surface of the substrate corresponding to the ground region; and forming a metal layer on a bottom surface of the substrate and on an inner surface of the hole.

The active region comprising the transistor regions, the ground region and the field regions are preferably formed by forming a pad oxide film on the substrate by thermal oxidation; forming a mask layer by depositing nitrides silicon over the pad oxide film by chemical vapor deposition; and patterning the mask layer and the pad oxide film by photo-etching to thereby expose portions of the substrate; however, other methods may also be appropriate.

Each field oxide film preferably has a local oxidation of silicon structure or a shallow trench isolation structure. The gate electrode are preferably formed by depositing at least one of amorphous silicon or polycrystalline silicon which is doped with an impurity over the field regions and the gate oxide films formed on transistor regions by chemical vapor deposition; and patterning the silicon by photo-etching so that the silicon remains at predetermined portions of the first and second transistor regions; however, other methods may also be appropriate.

The impurity regions and the ion diffusion layer are preferably formed by forming a first photoresist pattern on portions of the substrate corresponding to the ground region and the second transistor region; ion-implanting the first conductive impurity into the first transistor region by masking the first photoresist pattern; removing the first photoresist pattern; forming a second photoresist pattern on a portion of the substrate of the first transistor region; and ion-implanting the second conductive impurity into the ground region and the second transistor region; however, other methods may also be appropriate. The first and second conductive impurities preferably have opposite types.

The first, second and third wiring layer patterns are preferably connected to an output voltage line, a ground line and a source voltage line, respectively. Furthermore, the second wiring layer pattern may be connected to at least one of the impurity regions. Further, the second wiring layer pattern is preferably connected to the ion diffusion layer of the ground region. Each of the first, second and third wiring layer patterns and the metal layer are preferably formed of at least one of aluminum, aluminum-alloy and copper.

The hole is preferably formed by making a portion of the bottom surface of the substrate corresponding to the ground region porous silicon by the electropolishing system; and selectively etching the porous silicon portion. The metal layer may be linked with the second wiring layer pattern, thereby serving as the ground line.

The protection film pattern is preferably formed of at least one of phosphorous silicate glass, silicon oxide or silicon nitrides, or the combination thereof The bonding pad corresponding to the second wiring layer pattern is preferably connected to the ground.

The invention can be achieved in a whole or in parts by a semiconductor device, comprising: a substrate; a first transistor formed in a first region of the substrate, the transistor having a first doped region formed in the first region, a second doped region formed in the first region and a control electrode formed between the first and second doped regions; a second transistor formed in a second region of the substrate, the second transistor having a third doped region formed in the second region, a fourth doped region formed in the second region and a control electrode formed between the third and fourth doped regions, wherein the first doped region is coupled for providing an output voltage, the fourth doped region is coupled for receiving a source voltage and the second and third electrode are connected to each other for receiving a ground voltage.

The invention can also be achieved in whole or in parts by an integrated device comprising: a substrate having first and second surfaces, which are opposing surfaces; a first semiconductor device formed in a first region of the substrate; a second semiconductor device formed in a second region of the substrate; a contact hole formed through the second surface of the substrate and separating the first and second regions; and a conductive layer formed in the contact hole, wherein the first and second semiconductor devices and the conductive layer are coupled to each other by a wiring layer formed over the first surface of the substrate, the wiring layer having first, second and third protrusions, the first, second and third protrusions being in contact with the first and second semiconductor devices and the conductive layer, respectively.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1A:
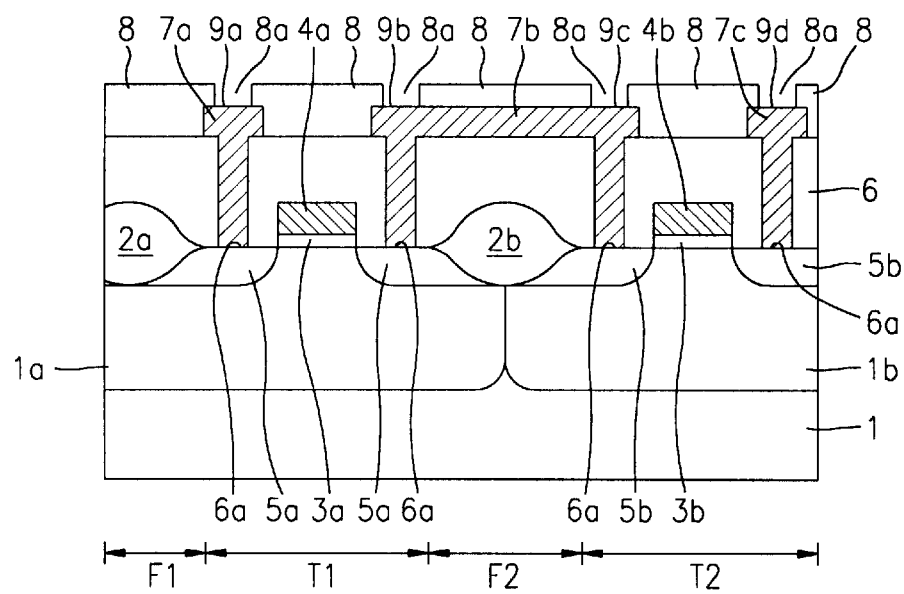
FIG. 1A is a cross-sectional view of a background art semiconductor device.
Figure 1B:
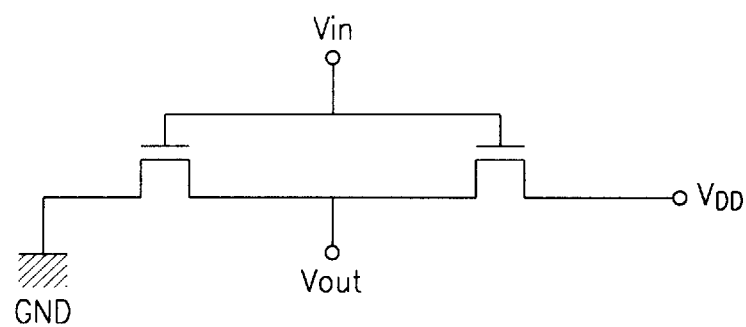
FIG. 1B is a circuit diagram of the semiconductor device of FIG. 1A.
Figure 2A:
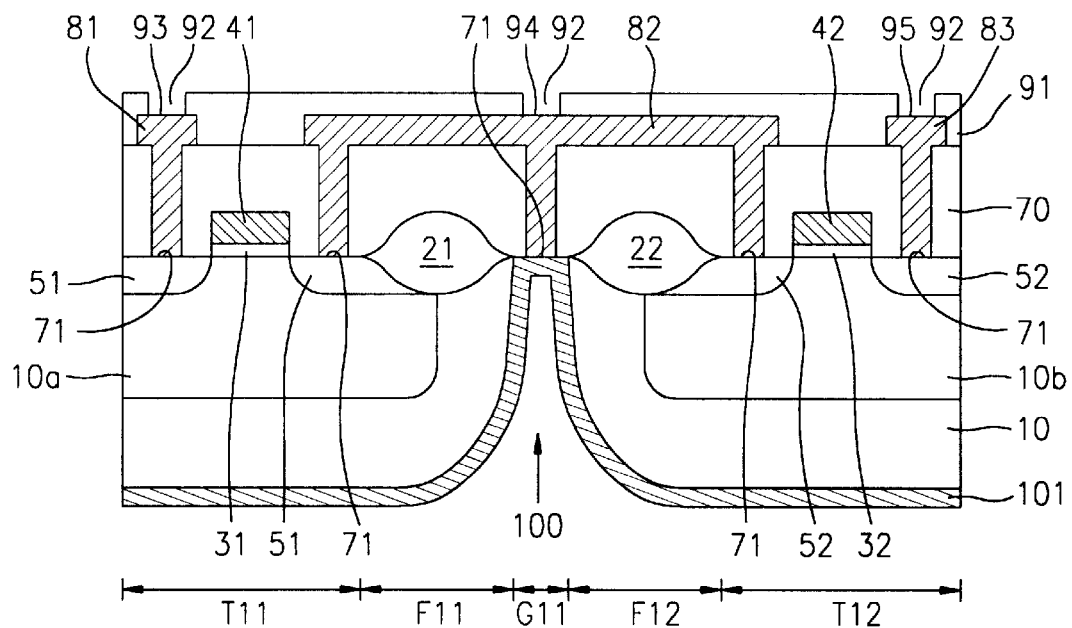
FIG. 2A is a cross-sectional view of a semiconductor device according to a preferred embodiment of the invention.
Figure 2B:
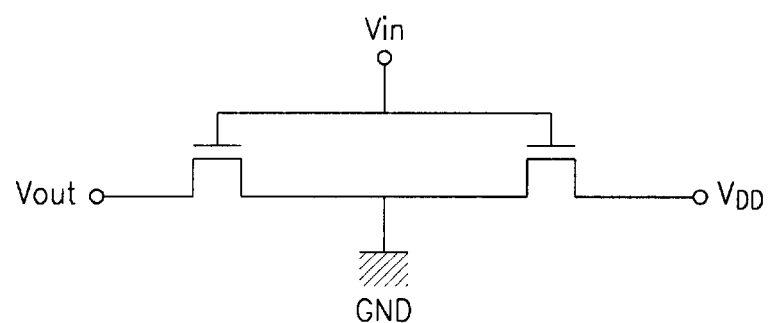
FIG. 2B is a circuit diagram of the semiconductor device of FIG. 2A.

FIG. 2A is a cross-sectional view of a semiconductor device according to a preferred embodiment of the invention and FIG. 2B is a circuit diagram of the semiconductor device of FIG. 2A. Referring to FIGS. 2A and 2B, using ion implantation, a p-well 10a and a n-well 10b are formed in a semiconductor substrate 10 having an active region formed of first and second transistor regions T11, T12, a ground region G11 and field regions F11, F12. Field oxide films 21, 22, preferably of a LOCOS structure are formed at the field regions F11, F12, respectively, of the substrate 10. The first and second transistor regions T11, T12 belonging to the p-well 10a and the n-well 10b, respectively, are formed on opposite sides of the respective fields F11, F12, while the ground region G11 is defined between the field regions F11, F12. Field oxide films of a STI structure can replace the field oxide films 21, 22 of the LOCOS structure; however, other structures also may be appropriate. In addition, a NMOS transistor and a PMOS transistor are formed in the first and second transistors regions T11, T12, respectively.

Further, gate electrodes 41, 42 are formed at portions of the substrate 10 which correspond to the first and second transistor parts T11, T12 and gate oxide films 31, 32 are respectively formed between the gate electrodes 41, 42 and the substrate 10. An impurity region 51 doped with a first conductive impurity is formed at both sides of the gate electrode 41 in the first transistor region T11, while an impurity region 52 doped with a second conductive impurity is formed at both sides of the gate electrode 42 in the second transistor region T12. The impurity regions 51, 52 serve as source regions and drain regions with the first and second conductive impurities preferably being a n-type and a p-type, respectively.

A layer-insulating film 70 having a plurality of contact holes 71 is formed on the entire structure. The plurality of contact holes 71 expose portions of the surface of the substrate 10 that correspond to the impurity regions 51, 52 and the ground region G11. First, second and third wiring layer patterns 81, 82, 83 are formed on an upper surface of the layer-insulating film 70 and in the contact holes 71. The layer-insulating film 70 is preferably formed of a material, such as, for example, spin on glass (SOG), boron doped phosphorous silicate glass (BPSG), or plasma enhancement-tetraethylorthosilicate (PE-TEOS); however, other materials may also be appropriate.

The first, second and third wiring layer patterns 81, 82, 83 are used as an output voltage (VOUT) line, a ground (GND) line and a source voltage (VDD) line, respectively, and the gate electrodes 41, 42 are used as Vin lines. The ground region Gil is connected to the second wiring layer pattern 82, which is the ground metal line.

A protection film pattern 91 having a plurality of openings (or bonding pad units) 92 is formed to prevent scratches and contamination of the structure surface. The openings 92 expose portions of the wiring layer patterns 81, 82, 83. The protection film pattern 91 is preferably formed of phosphorous silicate glass (PSG), silicon oxide, silicon nitrides, or a combination thereof; however, other materials may also be appropriate. Further, the portions of the wiring layer patterns 81, 82, 83 which are exposed by the openings 92 form bonding pads 93, 94, 95. The bonding pad 94 serves as ground.

A hole 100 is formed on a bottom surface of the substrate 10 corresponding to the ground region G11 by electropolishing using an electropolishing system. A metal layer 101 is formed on a bottom surface of the substrate 10 and in the hole 100. The metal layer 101 is electrically linked with the second wiring layer pattern 82 and serves as the GND line.

Figure 3A:
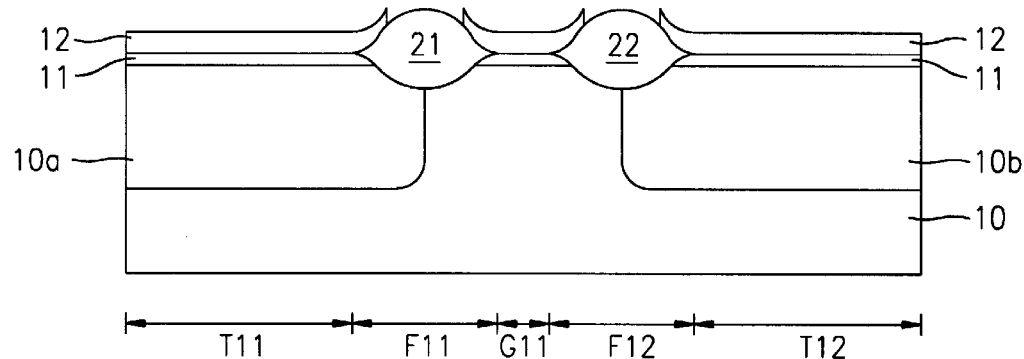
FIGS. 3A through 3E are diagrams which sequentially illustrate a fabrication process of the semiconductor device of FIG. 2A according to a preferred embodiment of the invention.

To fabricate the semiconductor device according to the preferred embodiment of the invention, first, as shown in FIG. 3A, a pad oxide film 11 is formed on a semiconductor substrate 10 preferably at a thickness of about 100 to 200A by thermal oxidation. The substrate 10 has a p-well 10a and a n-well 10b. A mask layer 12 is formed by depositing silicon nitrides on the pad oxide film 11 by chemical vapor deposition (CVD) preferably at a thickness of 1000 to 2000A. Then, the mask layer 12 and the pad oxide film 11 are patterned by photo-etching to expose portions of the substrate 10, thereby defining an active region formed of first and second transistor regions T11, T12, a ground region Gil and field regions F11, F12. The first and second transistor regions F11, F12 belong to the p-well 10a and the n-well 10b, respectively. Since the p-well 10a and n-well 10b are separately formed by a known ion implantation, the description of forming the p-well 10a and n-well 10b will be omitted. The field oxide films 21, 22 can have the STI structure as well as the LOCOS structure; other structures may also be appropriate.

Figure 3B:
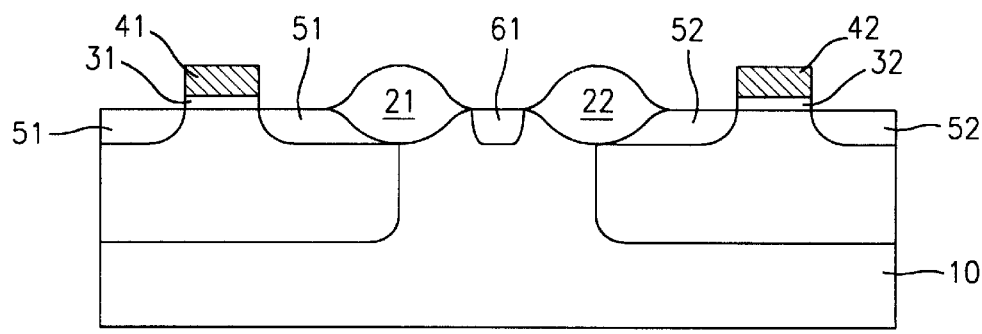

Referring to FIG. 3B, the mask layer 12 and the pad oxide film 11 are removed and gate oxide films 31, 32 are respectively formed preferably at a thickness of 40 to 100A by thermal oxidation on portions of the substrate 10 corresponding to the first and second transistor regions T11, T12. Then, amorphous silicon or polycrystalline silicon (not shown) which is doped with an impurity is deposited by CVD over the field regions F11, F12 and the gate oxide films 31, 32 and the silicon is patterned by photo-etching to remain only at specific portions of the transistor regions T11, T12, thereby forming gate electrodes 41, 42, respectively.

Further, impurity regions 51, 52 doped with first and second conductive impurities, respectively, which will be used as a source and a drain are separately formed on both sides of each of the gate electrodes 41, 42 in the transistor regions T11, T12, respectively. An ion impurity diffusion layer 61 which is doped with the second conductive impurity is formed in the ground region G11. The first conductive impurity is a n-type and a second conductive impurity is a p-type. More specifically, the impurity region 51 is formed by forming a first photoresist pattern over the surface of the substrate 10 in the ground region G11 and the second transistor region T12. The first conductive impurity is then ion-implanted into the transistor region T11 by using the first photoresist pattern as the mask. The impurity region 52 and the ion diffusion layer 61 are formed by removing the first photoresist pattern for forming the impurity region 51, and then forming a second photoresist pattern on the surface of the substrate 10 in the first transistor region T11, ion-implanting the second conductive impurity into the ground region Gil and the second transistor region T12, and then removing the second photoresist pattern which was used as the mask.

Figure 3C:
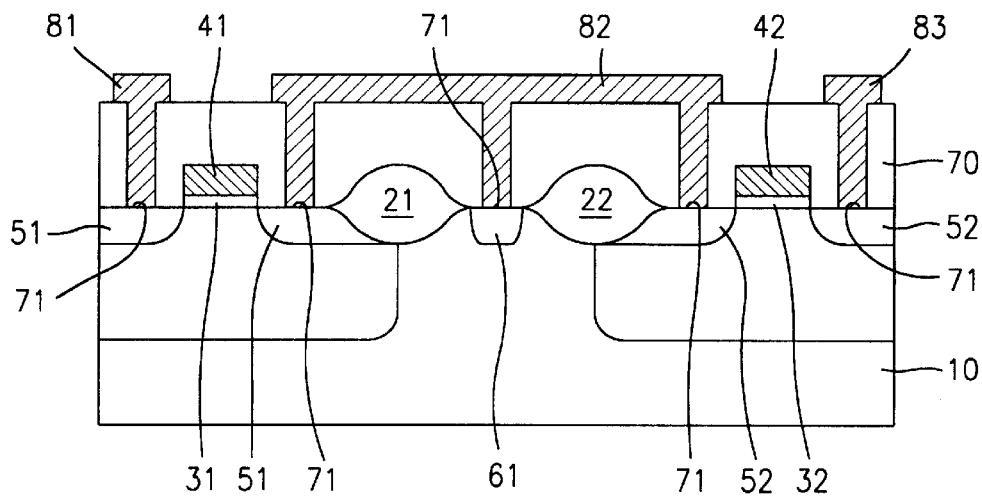

As shown in FIG. 3C, a layer-insulating film 70 having a plurality of contact holes 71 is next formed on the substrate, and a wiring layer is deposited over the layer-insulating film 70 and in the contact holes 71. The wiring layer is etched by using a metallization mask, thereby forming first, second and third wiring layer patterns 81, 82, 83. The layer-insulating film 70 is preferably formed of a material such as, for example, SOG, BPSG and PE-TEOS, etc.; however, other materials may also be appropriate. Similar to FIG. 2B, the first, second and third wiring patterns 81, 82, 83 in FIG. 3C are used as the VOUT, GND, VDD lines, respectively, and the gate electrodes 41, 42 are respectively used as the Vin line. More specifically, the ion diffusion layer 61 in the ground region G11 is connected to the second wiring layer pattern 82.

Figure 3D:
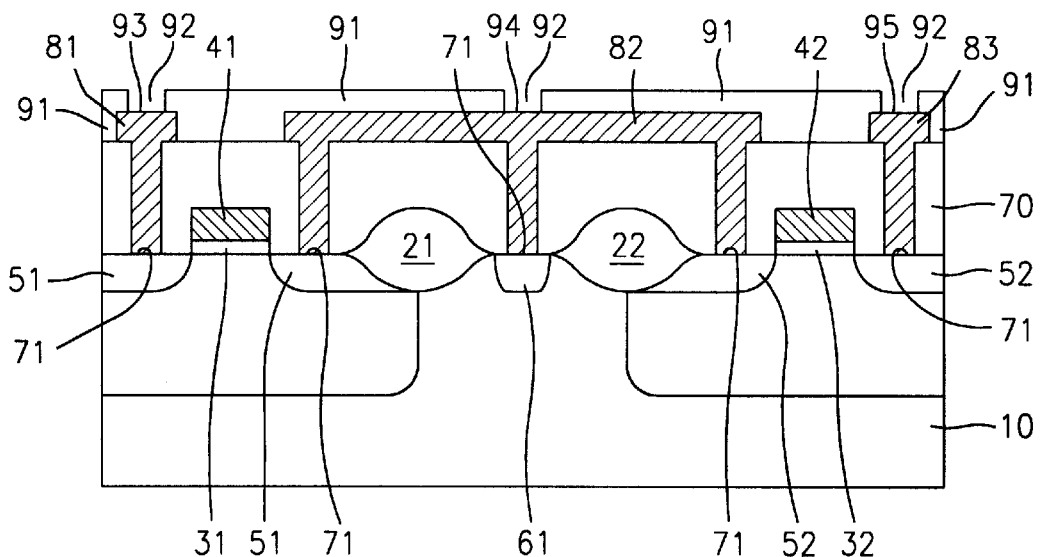

Further in FIG. 3D, a protection film is deposited over the structure and partially etched by using an etching mask, thereby forming a protection film pattern 91 having a plurality of openings (or bonding pad units) which expose portions of the wiring layer patterns 81, 82, 83. The protection film pattern 91 is preferably formed of, for example, PSG, silicon oxide or silicon nitrides or combinations thereof to prevent the contamination and scratches of the structure surface; however, other materials may also be appropriate. Portions of the wiring layer patterns 81, 82, 83 exposed by the openings are referred to bonding pads 92, 94, 95, respectively. The bonding pad 94 serves as a ground.

Figure 3E:
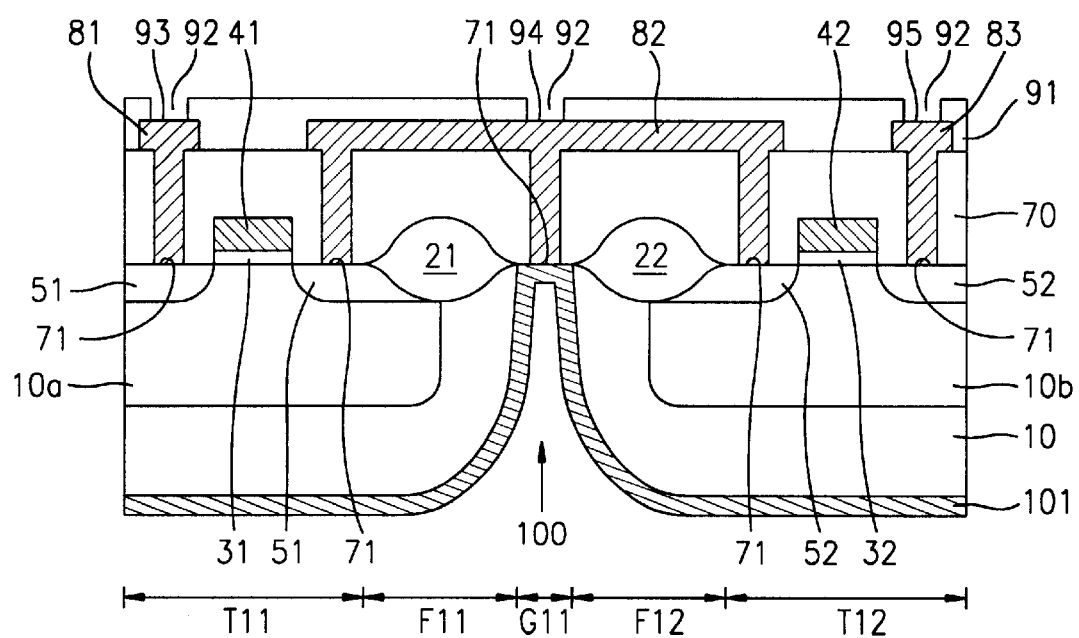

Lastly, referring to FIG. 3E, a hole 100 is formed on a bottom surface of a portion of the substrate 10 corresponding to the ground region G11 by electropholishing using an electropolishing system, and a metal layer 101 is formed on a bottom surface of the substrate 10 in the ground region G11 and in the hole 100. The metal layer 101 is electrically connected to the second wiring layer pattern 82 and also serves as the GND line.

Figure 4:
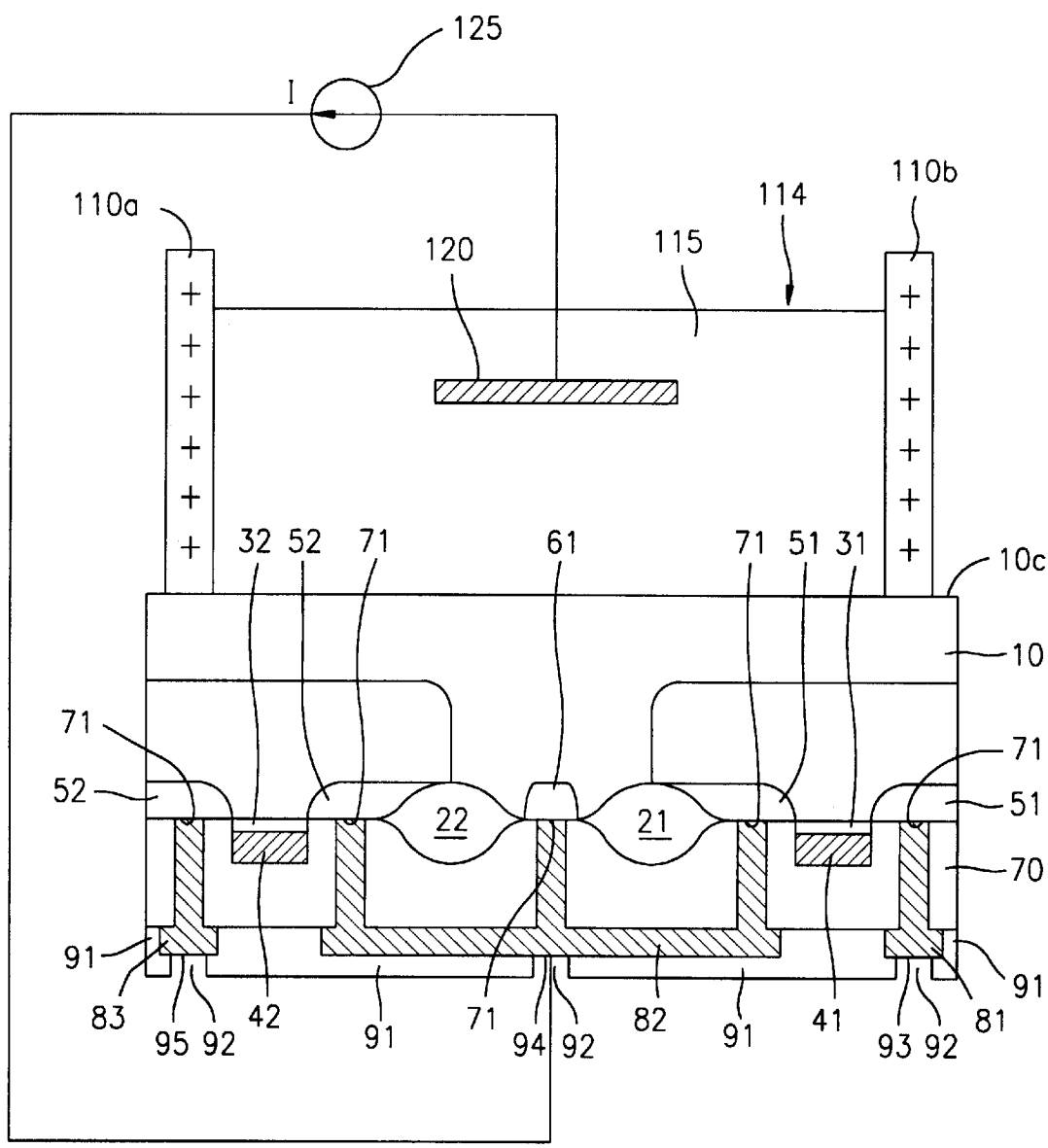
FIG. 4 is a schematic diagram of an electropolishing system according to a preferred embodiment of the invention.

Specifically, an electropolishing system is shown in FIG. 4. The electropolishing system of FIG. 4 includes reaction tubes 110a, 110b, an etchant solution 115, an electrode 120, a constant current source 125 and the substrate 10. The silicon etchant solution 115 is filled in a space 114 delimited by the reaction tubes 110a, 110b and the substrate 10. A bottom surface 10c of the substrate 10 is attached, facing the space 114, to ends of the reaction tubes 110, 110, and the constant current source 125 is connected to the second wiring layer pattern 82, of the substrate 10 and the electrode 120. The hole 100 is formed using such an electropolishing system, by which the bottom surface 10c of the substrate 10 corresponding to the ground region G11, which is exposed to the silicon etchant solution 115, becomes the state of porous silicon when a current is supplied to the surface of the substrate 10 through the ground metal line, which is the second wiring layer pattern 82, and such porous region is selectively etched and is selfaligned. The technique of forming the hole at the bottom surface of the silicon substrate by electropolishing using the electropolishing system is disclosed in detail in U.S. Pat. No. 5,565,084.

The semiconductor device and the fabrication method thereof according to the invention has several advantages. For example, operational properties of the devices are stabilized by preventing voltage drop in the ground line since the metal layer linked with the wiring layer and serving as the ground line on the surface of the substrate is formed on the bottom surface of the same substrate. Also, the increase in the area occupied by the bonding pads on the substrate is restrained by controlling the number of the bonding pads according to the high-integration of the devices. Moreover, the package size is decreased by reducing the number of the wires which are bonded to the bonding pads for the electrical connection of the exterior.

While the invention has been described in conjunction with specific embodiments; thereof, it is evident that many alternatives, modifications and variations may be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A semiconductor device, comprising:
   a semiconductor substrate having a top surface and a bottom surface and having an active region comprising at least two transistor regions, at least one ground region and at least two field regions;
   field oxide films formed on the top surface of the substrate within the field regions
   gate electrodes formed over predetermined portions of the top surface of the substrate corresponding to the transistor regions; and
   gate oxide films interposed between the substrate and the corresponding gate electrodes;
   impurity regions doped with first and second conductive impurities, formed on both sides of each of the gate electrodes in the transistor regions;
   a layer-insulating film having a plurality of contact holes formed over the top surface of the semiconductor substrate, the field oxide films, the gate electrodes and the impurity regions, the layer-insulating film exposing portions of an upper surface of the substrate corresponding to the ground region and the impurity regions;
   first, second and third wiring layer patterns formed on the layer-insulating film and in the contact holes;
   a protection film pattern having a plurality of contact holes formed over the top surface of the semiconductor substrate, the field oxide films, the gate electrodes, the impurity regions, the laver-insulating film and the first, second and third wiring layer patterns, the protection film pattern for thereby forming bonding pads corresponding to the first, second and third wiring layer patterns;
   a hold formed in a portion of the bottom surface of the substrate corresponding to the ground region; and
   a metal layer formed on the bottom surface of the substrate and on an inner surface of the hole, wherein the second wiring layer pattern is electrically coupled to the ground region and the at least two transistor regions.

2. The device according to claim 1, wherein the field oxide films have one of a local oxidation of silicon and a shallow trench isolation structure.

3. The device according to claim 1, wherein each gate electrode is formed of one of amorphous silicon and polycrystalline silicon which is doped with an impurity.

4. The device according to claim 1, wherein the first conductive impurity is a p-type and the second conductive impurity is a n-type.

5. The device according to claim 1, wherein the first conductive impurity is a n-type and the second conductive impurity is a p-type.

6. The semiconductor device according to claim 1, wherein the impurity regions serve as a source and a drain.

7. The device according to claim 1, wherein the layer-insulating film is formed of at least one of spin on glass, boron doped phosphorus silicate glass and plasma enhancement-tetraethylorthosilicate.

8. The device according to claim 1, wherein the first, second and third wiring layer patterns serve as an output voltage line, a ground line and a source voltage line.

9. The device according to claim 8, wherein the second wiring layer pattern is connected to at least one of the impurity regions.

10. The device according to claim 8, wherein the second wiring layer pattern is connected to an ion diffusion layer of the ground region.

11. The device according to claim 1, wherein the bonding pad corresponding to the second wiring layer pattern is connected to the ground.

12. The device according to claim 1, wherein each of the first, second and third wiring layer patterns and the metal layer is formed of at least one of aluminum, aluminum-alloy and copper.

13. The device according to claim 1, wherein the hole is formed self-aligningly using an electropolishing system.

14. The device according to claim 1, wherein the metal layer is linked with the second wiring layer pattern so as to serve as a ground line.

15. The device according to claim 1, wherein the protection film pattern is formed of at least one of phosphorus silicate glass, silicon oxide or silicon nitrides, or a combination thereof.

16. A semiconductor device, comprising:

a substrate;

a first transistor formed in a first region of the substrate, the transistor having a first doped region formed in the first region, a second doped region formed in the first region and a first control electrode formed between the first and second doped regions;

a second transistor formed in a second region of the substrate, the second transistor having a thirddoped region formed in the second region, a fourth doped region formed in the second region and a second control electrode formed between the third and fourth doped regions, wherein the first doped region is coupled for providing an output voltage, the fourth doped region is coupled for receiving a source voltage, the second and third doped regions are connected to each other for receiving a ground voltage, and the first and second control electrodes are connected to a common potential.

17. A semiconductor device, comprising:

a substrate;

a first transistor formed in a first region of the substrate, the transistor having a first doped region formed in the first region, a second doped region formed in the first region and a control electrode formed between the first and second doped regions;

a second transistor formed in a second region of the substrate, the second transistor having a third doped region formed in the second region, a fourth doped region formed in the second region and a control electrode formed between the third and fourth doped regions, wherein the first doped region is coupled for providing an output voltage, the fourth doped region is coupled for receiving a source voltage and the second and third doped regions are connected to each other for receiving a ground voltage, and wherein a contact hole is formed in a bottom surface of the substrate between the first and second transistors.

18. The semiconductor device of claim 17, wherein a conductive layer is formed in the contact hole and the bottom surface of the substrate.

19. The semiconductor device of claim 17, wherein a first field oxide is formed between the second doped region and the contact hole and a second field oxide is formed between the third doped region and the contact hole.

20. The semiconductor device of claim 18, wherein the second and third doped regions and the conductive layer are coupled to each other for receiving a ground voltage by a wiring layer having three prongs.

21. An integrated device, comprising:

a substrate having first and second surfaces, which are opposing surfaces;

a first semiconductor device formed in a first region of the first surface of the substrate;

a second semiconductor device formed in a second region of the first surface of the substrate;

a contact hole formed through the second surface of the substrate and separating the first and second regions; and a conductive layer formed in the contact hole, wherein the first and second semiconductor devices and the conductive layer are coupled to each other by a continuous wiring layer formed over the first surface of the substrate, the wiring layer having first, second and third protrusions, the first, second and third protrusions being in contact with the first and second semiconductor devices and the conductive layer, respectively.

22. The integrated device of claim 21, wherein the conductive layer covers the second surface.

23. The integrated device of claim 21, wherein a first field oxide is formed between the first semiconductor device and the contact hole, and a second field oxide is formed between the second semiconductor device and the contact hole.

24. The integrated device of claim 21, wherein the first and second semiconductor device and the wiring layer are covered by a protective layer, the protective layer having an opening to expose a portion of the wiring layer, the opening and the contact hole being aligned with each other.

25. A semiconductor device, comprising:

a semiconductor substrate having an active region comprising at least two transistor regions, at least one ground region and at least two field regions;

field oxide films formed on the substrate within the field regions;

gate electrodes formed over predetermined portions of the substrate corresponding to the transistor regions; and gate oxide films interposed between the substrate and the corresponding gate electrodes;

impurity regions doped with first and second conductive impurities, formed on both sides of each of the gate electrodes in the transistor regions;

a layer-insulating film having a plurality of contact holes formed over the semiconductor substrate, the field oxide films, the gate electrodes and the impurity regions, the layer-insulating film exposing portions of an upper surface of the substrate corresponding to the ground region and the impurity regions;

first, second and third wiring layer patterns formed on the layer-insulating film and in the contact holes;

a protection film pattern having a plurality of contact holes formed over the semiconductor substrate, the field oxide films, the gate electrodes, the impurity regions, the layer-insulating film and the first, second and third wiring layer patterns, the protection film pattern for thereby forming bonding pads corresponding to the first, second and third wiring layer patterns;

a hole formed at a portion of a bottom surface of the substrate corresponding to the ground region; and a metal layer formed on a bottom surface of the substrate and on an inner surface of the hole, wherein the first, second and third wiring layer patterns serve as an output voltage line, a ground line and a source voltage line, and wherein the second wiring layer pattern is connected to an ion diffusion layer of the ground region.

26. A semiconductor device, comprising a semiconductor substrate having an active region comprising at least two transistor regions, at least one ground region and at least two field regions;

field oxide films formed on the substrate within the field regions;

gate electrodes formed over predetermined portions of the substrate corresponding to the transistor regions; and gate oxide films interposed between the substrate and the corresponding gate electrodes;

impurity regions doped with first and second conductive impurities, formed on both sides of each of the gate electrodes in the transistor regions;

a layer-insulating film having a plurality of contact holes formed over the semiconductor substrate, the field oxide films, the gate electrodes and the impurity regions, the layer-insulating film exposing portions of an upper surface of the substrate corresponding to the ground region and the impurity regions;

first, second and third wiring layer patterns formed on the layer-insulating film and in the contact holes;

a protection film pattern having a plurality of contact holes formed over the semiconductor substrate, the field oxide films, the gate electrodes, the impurity regions, the layer-insulating film and the first, second and third wiring layer patterns, the protection film pattern for thereby forming bonding pads corresponding to the first, second and third wiring layer patterns;

a hole formed at a portion of a bottom surface of the substrate corresponding to the ground region; and a metal layer formed on a bottom surface of the substrate and on an inner surface of the hole, wherein the protection film pattern is formed of at least one of phosphorous silicate glass, silicon oxide or silicon nitrides, or a combination thereof.

27. An integrated device, comprising:

a substrate having first and second surfaces, which are opposing surfaces;

a first semiconductor device formed in a first region of the substrate;

a second semiconductor device formed in a second region of the substrate;

a contact hole formed through the second surface of the substrate and separating the first and second regions; and a conductive layer formed in the contact hole, wherein the first and second semiconductor devices and the conductive layer are coupled to each other by a wiring layer formed over the first surface of the substrate, the wiring layer having first, second and third protrusions, the first, second and third protrusions being in contact with the first and second semiconductor devices and the conductive layer, respectively, wherein a first field oxide is formed between the first semiconductor device and the contact hole, and a second field oxide is formed between the second semiconductor device and the contact hole.

28. An integrated device, comprising:

a substrate having first and second surfaces, which are opposing surfaces;

a first semiconductor device formed in a first region of the substrate;

a second semiconductor device formed in a second region of the substrate;

a contact hole formed through the second surface of the substrate and separating the first and second regions; and a conductive layer formed in the contact hole, wherein the first and second semiconductor devices and the conductive layer are coupled to each other by a wiring layer formed over the first surface of the substrate, the wiring layer having first, second and third protrusions, the first, second and third protrusions being in contact with the first and second semiconductor devices and the conductive layer, respectively, wherein the first and second semiconductor device and the wiring layer are covered by a protective layer, the protective layer having an opening to expose a portion of the wiring layer, the opening and the contact hole being aligned with each other.

* * * * *